(12) United States Patent
Murayama et al.

(10) Patent No.: US 9,374,889 B2
(45) Date of Patent: Jun. 21, 2016

(54) INTERPOSER AND ELECTRONIC COMPONENT PACKAGE

(71) Applicant: SHINKO ELECTRIC INDUSTRIES CO., LTD., Nagano (JP)

(72) Inventors: Kei Murayama, Nagano (JP); Mitsuhiro Aizawa, Nagano (JP); Koji Hara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 362 days.

(21) Appl. No.: 14/202,140

(22) Filed: Mar. 10, 2014

(65) Prior Publication Data

US 2014/0293564 A1 Oct. 2, 2014

(30) Foreign Application Priority Data

Mar. 27, 2013 (JP) .................. 2013-067463

(51) Int. Cl.
| | |
|---|---|
| H05K 1/14 | (2006.01) |
| H05K 1/02 | (2006.01) |
| H05K 3/46 | (2006.01) |
| H01L 23/00 | (2006.01) |

(Continued)

(52) U.S. Cl.
CPC .............. *H05K 1/0271* (2013.01); *H05K 3/467* (2013.01); *H01L 23/00* (2013.01); *H01L 2224/16225* (2013.01); *H01L 2224/32225* (2013.01); *H01L 2224/73204* (2013.01); *H01L 2924/15311* (2013.01); *H05K 1/0306* (2013.01); *H05K 3/4061* (2013.01); *H05K 3/4688* (2013.01); *H05K 2201/0179* (2013.01); *H05K 2201/068* (2013.01); *H05K 2201/10378* (2013.01)

(58) Field of Classification Search
CPC ...... H05K 1/0271; H05K 1/181; H05K 1/144
See application file for complete search history.

(56) References Cited

U.S. PATENT DOCUMENTS 5,633,072 A * 5/1997 Middelman ............. B32B 37/12
174/120 R
5,778,523 A * 7/1998 Sylvester ............ H01L 23/3735
174/260

(Continued)

FOREIGN PATENT DOCUMENTS

| JP | 2009-004507 | 1/2009 |
|---|---|---|
| JP | 2009-110983 | 5/2009 |

(Continued)

*Primary Examiner* — Jeremy C Norris
*Assistant Examiner* — Nathan Milakovich
(74) *Attorney, Agent, or Firm* — IPUSA, PLLC

(57) ABSTRACT

An interposer includes a wiring member including a first inorganic substrate, a reinforcement member including a second inorganic substrate, and an adhesive part interposed between the wiring member and the reinforcement member. Each of the first and second inorganic substrates includes first and second surfaces. Multiple inorganic insulating layers formed on the first surface of each of the first and second inorganic substrates have the same layer configuration and are arranged symmetrically in a vertical direction with the adhesive part centered therebetween. An inorganic insulating layer and an organic insulating layer formed on the second surface of each of the first and second inorganic substrates have the same layer configuration and are arranged symmetrically in the vertical direction with the adhesive part. An organic insulating layer formed on the second surface of each of the first and second inorganic substrates is an outermost insulating layer.

6 Claims, 9 Drawing Sheets

(51) Int. Cl.
*H05K 1/03* (2006.01)
*H05K 3/40* (2006.01)

(56) References Cited

U.S. PATENT DOCUMENTS

| | | | | |
|---|---|---|---|---|
| 7,671,281 | B2* | 3/2010 | Kusagaya | H05K 3/4602 |
| | | | | 174/255 |
| 8,129,830 | B2 | 3/2012 | Murayama | |
| 8,710,639 | B2* | 4/2014 | Kikuchi | H01L 21/6835 |
| | | | | 257/679 |
| 8,766,440 | B2* | 7/2014 | Kikuchi | H01L 23/5389 |
| | | | | 257/659 |
| 9,173,299 | B2* | 10/2015 | Sakurai | H01L 23/49822 |
| 9,184,104 | B1* | 11/2015 | Chia | H01L 23/3135 |
| 2004/0212030 | A1* | 10/2004 | Asai | G02B 6/12002 |
| | | | | 257/432 |
| 2005/0063635 | A1* | 3/2005 | Yamada | G02B 6/43 |
| | | | | 385/14 |
| 2006/0012967 | A1* | 1/2006 | Asai | G02B 6/43 |
| | | | | 361/764 |
| 2007/0119619 | A1* | 5/2007 | Nakamura | H01L 21/6835 |
| | | | | 174/262 |
| 2007/0223935 | A1* | 9/2007 | Asai | G02B 6/43 |
| | | | | 398/164 |
| 2009/0121344 | A1 | 5/2009 | Sunohara | |
| 2010/0243299 | A1* | 9/2010 | Kariya | H01L 21/486 |
| | | | | 174/255 |
| 2011/0214906 | A1* | 9/2011 | Baars | B05D 5/12 |
| | | | | 174/257 |
| 2013/0337648 | A1* | 12/2013 | Lin | H01L 21/486 |
| | | | | 438/675 |
| 2014/0048951 | A1* | 2/2014 | Lin | H01L 23/481 |
| | | | | 257/774 |
| 2015/0155256 | A1* | 6/2015 | Lin | H01L 24/81 |
| | | | | 257/737 |

FOREIGN PATENT DOCUMENTS

| | | |
|---|---|---|
| JP | 2009-260049 | 11/2009 |
| JP | 2011-066068 | 3/2011 |

* cited by examiner

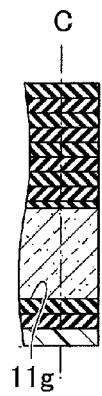
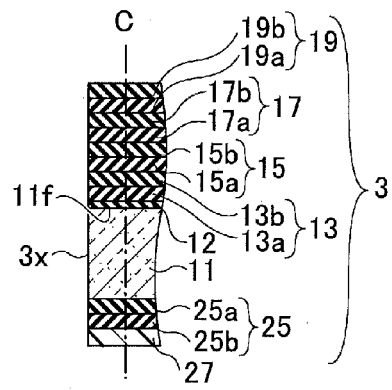
FIG.5A
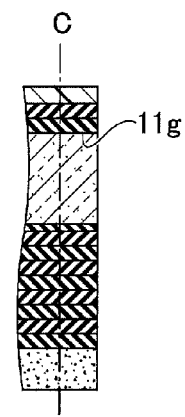
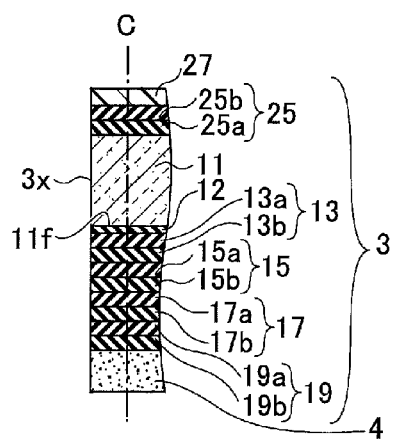
FIG.5B
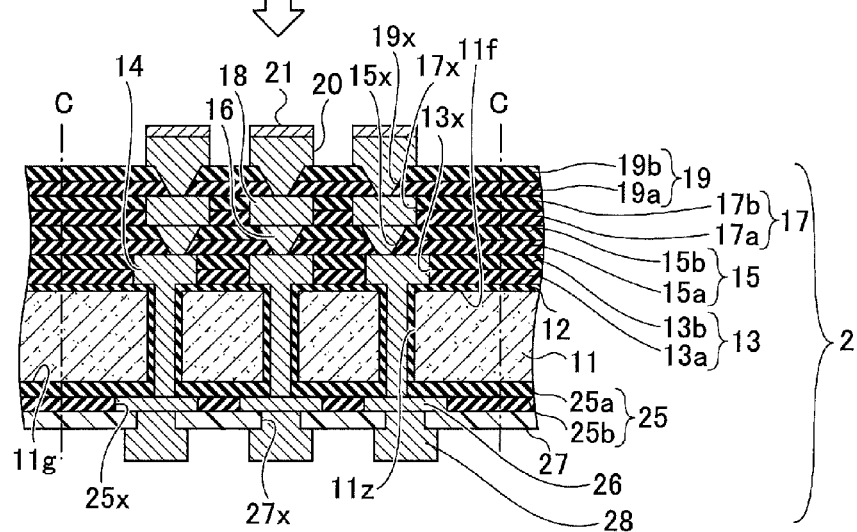

FIG.6

| | COMPARATIVE EXAMPLE 1 (NO FRAME) | COMPARATIVE EXAMPLE 2 (SILICON FRAME ONLY) | EXAMPLE (INTERPOSER 1) |
|---|---|---|---|
| WARPING AMOUNT | 195 μm | 147 μm | 100 μm |
| STRUCTURE | ONLY WIRING MEMBER 2 OF FIG. 1 (STRUCTURE WITHOUT REINFORCEMENT MEMBER 3 AND ADHESIVE PART 4) | ONLY FRAME-LIKE SILICON SUBSTRATE HAVING OXIDE FILM ON ITS SURFACE, INSTEAD OF REINFORCEMENT MEMBER 3 OF FIG. 1 | STRUCTURE OF FIG. 1 |

…

INTERPOSER AND ELECTRONIC COMPONENT PACKAGE

CROSS-REFERENCE TO RELATED APPLICATIONS

This application is based upon and claims the benefit of priority of the prior Japanese Patent Application No. 2013-067463 filed on Mar. 27, 2013, the entire contents of which are incorporated herein by reference.

FIELD

The embodiments discussed herein are related to an interposer and an electronic component package including an electronic component mounted on the interposer.

BACKGROUND

Conventionally, there is known an interposer for mounting an electronic component (e.g., MEMS (Micro Electro-Mechanical System) device, a semiconductor device) thereon or an electronic component package including the electronic component mounted on the interposer. For example, an interposer may have a structure formed by layering a silicon substrate including a through-electrode on a frame-like silicon substrate and mounting an electronic component on an inner side of the frame-like silicon substrate (see, for example, Japanese Laid-Open Patent Publication Nos. 2009-4507, 2009-260049).

In recent years, the pitch of wiring patterns (e.g., connection pads) of an electronic component that is mounted on an interposer is becoming narrower. Therefore, the interposer is desired to have a structure corresponding to the narrow pitch of the wiring patterns of the electronic component. The interposer includes a silicon substrate provided with through-electrodes and is structured to mount the electronic component directly on the through-electrodes of the silicon substrate. However, because the interposer is structured to directly mount the electronic component on the through-electrodes, it is difficult to mount an electronic component having narrow-pitched wiring patterns on the through-electrodes.

In order to miniaturize wiring patterns (reduce the pitch of wiring patterns) provided on a side for mounting an electronic component thereon, there is proposed an interposer including multi-layered wiring layers (see, for example, Japanese Laid-Open Patent Publication No. 2009-110983). This interposer includes a silicon substrate having two different layered structures in which one is provided on an upper side of the silicon substrate and the other is provided on a lower side of the silicon substrate.

However, with the interposer having different layered structures provided on the upper and lower sides of the silicon substrate, warping of the interposer occurs.

SUMMARY

According to an aspect of the invention, there is provided an interposer that includes a wiring member including a first inorganic substrate, a reinforcement member including a second inorganic substrate, the reinforcement member being formed on the first inorganic substrate, and an adhesive part interposed between the wiring member and the reinforcement member. The first inorganic substrate includes a first surface on a side toward the adhesive part and a second surface on a side opposite of the first surface. Multiple inorganic insulating layers and multiple wiring layers are formed on the first surface of the first inorganic substrate. An inorganic insulating layer, a wiring layer, and an organic insulating layer are formed on the second surface of the first inorganic substrate. The second inorganic substrate includes a first surface on a side toward the adhesive part and a second surface on a side opposite of the first surface. Multiple inorganic insulating layers are formed on the first surface of the second inorganic substrate. An inorganic insulating layer and an organic insulating layer are formed on the second surface of the second inorganic substrate. The multiple inorganic insulating layers formed on the first surface of the first inorganic substrate and the plural inorganic insulating layers formed on the first surface of the second inorganic substrate have the same layer configuration and are arranged symmetrically in a vertical direction with the adhesive part centered therebetween. The inorganic insulating layer and the organic insulating layer formed on the second surface of the first inorganic substrate and the inorganic insulating layer and the organic insulating layer formed on the second surface of the second inorganic substrate have the same layer configuration and are arranged symmetrically in the vertical direction with the adhesive part. The organic insulating layer formed on the second surface of the first inorganic substrate is an outermost insulating layer of the wiring member. The organic insulating layer formed on the second surface of the second inorganic substrate is an outermost insulating layer of the reinforcement member.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIGS. 5A-5B illustrate processes for manufacturing the interposer of the first embodiment (part 4);

FIG. 6 is a table illustrating results of measuring warping amounts of a first comparative example, a second comparative example, and an example of the present invention;

DESCRIPTION OF EMBODIMENTS

Figure 1A:
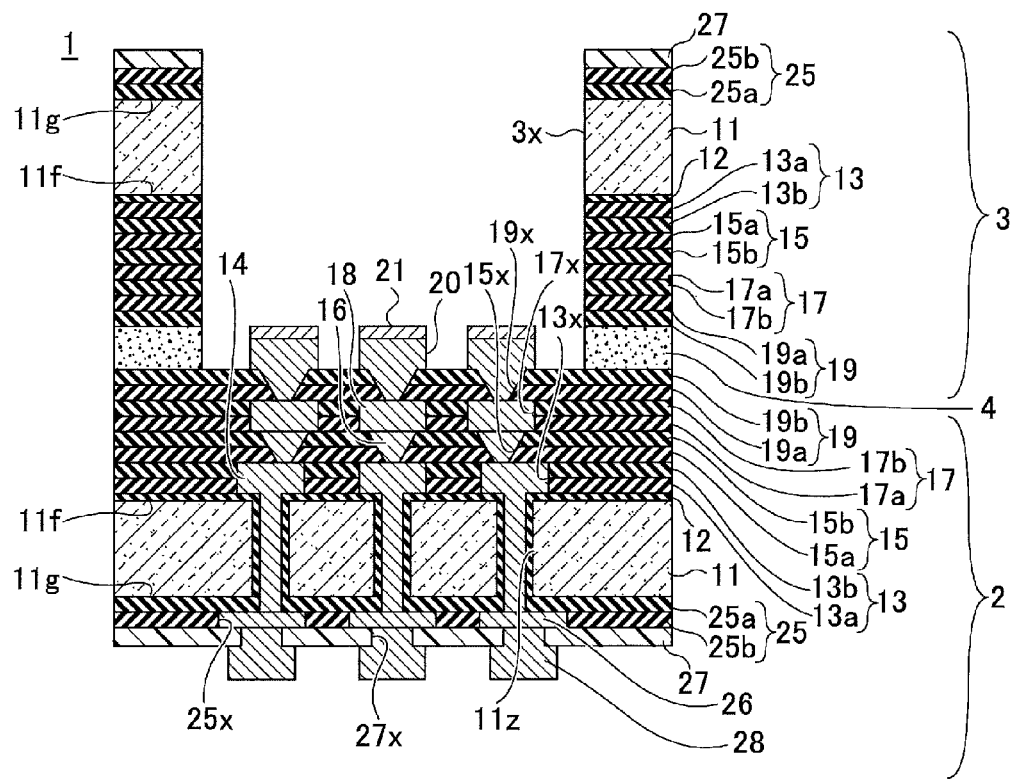
FIG. 1A is a cross-sectional view illustrating an interposer of the first embodiment.

In the following, illustrative embodiments of the present invention are described with reference to the accompanying drawings. Throughout the drawings, like components/parts may be denoted with like reference numerals and further description thereof may be omitted.

First Embodiment

Figure 1B:
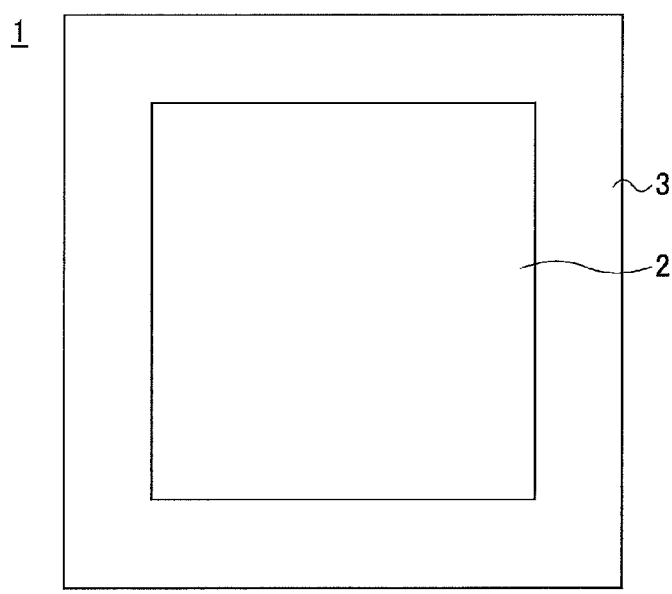
FIG. 1B is a plan view illustrating the interposer of the first embodiment.

A structure of an interposer 1 according to the first embodiment of the present invention is described. FIGS. 1A and 1B are schematic diagrams illustrating the structure of the interposer 1 according to the first embodiment of the present invention. FIG. 1A is a cross-sectional view illustrating the interposer 1 of the first embodiment, and FIG. 1B is a plan view illustrating the interposer 1 of the first embodiment.

With reference to FIGS. 1A and 1B, the interposer 1 includes a wiring member 2, a reinforcement member 3, and an adhesive part 4. In the interposer 1, the reinforcement member 3 is layered on the wiring member 2 interposed by the adhesive part 4. The wiring member 2 includes an inorganic substrate 11. The wiring member 2 also includes multiple wiring layers 14, 16, 18, 20 and inorganic insulating layers 12, 13, 15, 17, 19 formed on one side of the inorganic substrate 11, and multiple wiring layers 26, 28, an inorganic insulating layer 25, and an organic insulating layer 27 formed on the other side of the inorganic substrate 11. The reinforcement member 3, which has a frame-like shape, also includes an inorganic substrate 11. Further, the reinforcement member 3 includes multiple inorganic insulating layers 12, 13, 15, 17, 19 formed on one side of the insulating layer 11 and an inorganic insulating layer 25 and an organic insulating layer 27 formed on the other side of the insulating layer 11. The insulating layers included in the wiring member 2 and the insulating layers included in the reinforcement member 3 have the same layer configuration. Further, the insulating layers (i.e. inorganic insulating layers 12, 13, 15, 17, 19, 25, and organic insulating layer 27) of the wiring member 2 and corresponding insulating layers (i.e. inorganic insulating layers 12, 13, 15, 17, 19, 25, and organic insulating layer 27) of the reinforcement member 3 are arranged symmetrically in a vertical direction with the adhesive part 4 centered between the wiring member 2 and the reinforcement member 3.

Further, the thicknesses of the insulating layers of the wiring member 2 (i.e. inorganic insulating layers 12, 13, 15, 17, 19, 25, and organic insulating layer 27) and the thicknesses of corresponding insulating layers (i.e. inorganic insulating layers 12, 13, 15, 17, 19, 25, and organic insulating layer 27) of the reinforcement member 3 are the same. It is to be noted that the "same thicknesses" not only includes the thicknesses being exactly the same but also includes the thicknesses being substantially the same. That is, the thicknesses may differ to the extent that the effect (warping prevention) according to an embodiment of the present invention can be attained.

Next, components/parts included in the wiring member 2 and the reinforcement member 3 are described in further detail. It is to be noted that, for the sake of convenience, a surface positioned toward a side of the organic insulating layer 27 of the reinforcement member 3 (upper side of FIG. 1A) may be described as "one surface" or "upper surface" whereas a surface positioned toward the organic insulating layer 27 of the wiring member 2 (lower side of FIG. 1A) may be described as "other surface", "another surface" or "lower surface".

First, the wiring member 2 according to an embodiment of the present invention is described. The wiring member 2 includes the inorganic substrate 11. The wiring member 2 also includes, for example, the inorganic insulating layer 12, the inorganic insulating layer 13, the wiring layer 14, the inorganic insulating layer 15, the wiring layer 16, the inorganic insulating layer 17, the wiring layer 18, the inorganic insulating layer 19, the wiring layer 20, and the metal layer 21 that are provided on a one surface 11$f$ of the inorganic substrate 11. That is, the wiring member 2 has a wiring structure body including multiple inorganic insulating layers and wiring layers alternately formed one on top of the other on the one surface 11$f$ of the inorganic substrate 11. Further, the wiring layer 20 is used as an electronic component mounting pad for electrically connecting the interposer 1 to an electronic component mounted on the interposer 1. The wiring member 2 also includes, for example, the inorganic insulating layer 25, the wiring layer 26, the organic insulating layer 27, and the wiring layer 28 that are provided on another surface 11$g$ of the inorganic substrate 11. Further, the wiring layer 28 is used as an external connection pad for electrically connecting the interposer 1 to another wiring substrate.

The inorganic substrate 11 is a part of the interposer 1 that is used as a base on which a wiring structure including inorganic insulating layers and wiring layers is formed. A plan-view shape of the inorganic substrate 11 may be, for example, a 40 mm square quadrate. The thickness of the inorganic substrate 11 may be, for example, approximately 100 μm. Multiple through-holes 11$z$ are formed in the inorganic substrate 11. The plan-view shape of the through-hole 11$z$ may be, for example, a circle having a diameter of approximately 10 μm. The pitch of the through-holes 11$z$ may be, for example, approximately 50 μm. The inorganic substrate 11 included in the wiring member 2 may hereinafter also be referred to as "first inorganic substrate".

The interposer 1 can be used as an electronic component package by mounting an electronic component such as an MEMS device or a semiconductor device thereon. The MEMS device or the semiconductor device often includes a silicon substrate. Therefore, in using the interposer as the electronic component package, silicon or a material having a thermal expansion coefficient similar to silicon (e.g., borosilicate glass) is preferred to be used as the material of the inorganic substrate 11 from the standpoint of matching thermal expansion coefficients.

Borosilicate glass is a glass material that mainly includes boric acid ($B_2O_3$) and silicic acid ($SiO_2$). The thermal expansion coefficient of borosilicate glass is approximately 3 ppm/° C.

The reason for matching the thermal expansion coefficient of the inorganic substrate 11 and the thermal expansion coefficient of the MEMS device or the semiconductor device is for reducing thermal stress generated at a bonding part between the interposer 1 and the MEMS device or the semiconductor device even in a case where the MEMS device or the semiconductor device is used in a high temperature atmosphere or a low temperature atmosphere. In the below-described embodiment, silicon is used as the material of the inorganic substrate 11.

The inorganic insulating layer 12 is formed to cover the one surface 11$f$ of the inorganic substrate 11 and an inner wall surface of the through-hole 11$z$. For example, a thermal oxide film (e.g., $SiO_2$ film) may be used as the material of the inorganic insulating layer 12. The thickness of the inorganic insulating layer 12 may be, for example, approximately 1 μm.

The inorganic insulating layer 13 is layered on an upper surface of the inorganic insulating layer 12. The inorganic insulating layer 13 includes an opening part 13$x$. The inorganic insulating layer 12, which covers one surface 11$f$ of the inorganic substrate 11 and the inner wall surface of the through-hole 11$z$, is exposed in the opening part 13$x$. The inorganic insulating layer 13 may have a layered structure including a first inorganic insulating film 13a and a second inorganic insulating film 13b formed on the first inorganic insulating film 13a.

For example, a silicon nitride film (SiN film) may be used as the material of the first inorganic insulating film 13a. For example, a silicon oxide film ($SiO_2$ film) may be used as the material of the second inorganic insulating film 13b. The thickness of the first inorganic insulating film 13a may be, for example, approximately 0.1 μm. The thickness of the second inorganic insulating film 13b may be, for example, 1 μm.

Warping of the inorganic substrate 11 can be prevented by using the thermal oxide film ($SiO_2$ film) as the material of the inorganic insulating layer 12 and forming the inorganic insulating layer 13 having a two-layer structure that includes a silicon oxide film ($SiO_2$ film) layered on a silicon nitride film (SiN film). The reason that warping can be prevented is explained in the below-described manufacturing process.

The wiring layer 14 is formed to fill the through-hole 11z having its inner wall surface covered by the inorganic insulating layer 12. Further, the wiring layer 14 is also formed to extend to the upper surface of the inorganic insulating layer 12 exposed in the opening part 13x. An upper surface of the wiring layer 14 may be flush with, for example, an upper surface of the inorganic insulating layer 13. More specifically, the upper surface of the wiring layer 14 may be flush with, for example, an upper surface of the second inorganic insulating film 13b of the inorganic insulating layer 13. A portion of the wiring layer 14 that fills the through-hole 11z functions as a through-wiring whereas a portion of the wiring layer 14 that is exposed in the opening part 13x functions as a wiring pattern. Alternatively, the portion of the wiring layer 14 that is exposed in the opening part 13x may be used as a pad having, for example, a circular shape from a plan view. A lower surface of the wiring layer 14 projects, for example, 10 μm from the other surface 11g of the inorganic substrate 11. For example, copper (Cu) may be used as the material of the wiring layer 14. The wiring layer 14 may also include a metal material other than copper (Cu) such as titanium (Ti).

The inorganic insulating layer 15 is layered on the upper surface of the inorganic insulating layer 13 and the upper surface of the wiring layer 14. The inorganic insulating layer 15 includes an opening part (via hole) 15x. The upper surface of the wiring layer 14 is exposed in the opening part 15x. The inorganic insulating layer 15 may have a layered structure including a first inorganic insulating film 15a and a second inorganic insulating film 15b formed on the first inorganic insulating film 15a. The first and second inorganic insulating films 15a, 15b may have, for example, the same material and thickness as the material and the thickness of the first and second inorganic insulating films 13a, 13b.

The wiring layer 16 is a via wiring that fills the opening part 15x. A lower surface of the wiring layer 16 contacts the upper surface of the wiring layer 14 exposed in the opening part 15x. The wiring layer 16 is electrically connected to the wiring layer 14. The upper surface of the wiring layer 16 may be flush with, for example, the upper surface of the inorganic insulating layer 15. More specifically, the upper surface of the wiring layer 16 may be flush with, for example, the upper surface of the second inorganic insulating film 15 of the inorganic insulating layer 15. The material of the wiring layer 16 may be, for example, the same as the material of the wiring layer 14.

The inorganic insulating layer 17 is layered on the upper surface of the inorganic insulating layer 15 and the upper surface of the wiring layer 16. The inorganic insulating layer 17 includes an opening part 17x. The upper surface of the wiring layer 16 is exposed in the opening part 17x. The inorganic insulating layer 17 may have a layered structure including a first inorganic insulating film 17a and a second inorganic insulating film 17b formed on the first inorganic insulating film 17a. The first and second inorganic insulating films 17a, 17b may have, for example, the same material and thickness as the material and the thickness of the first and second inorganic insulating films 13a, 13b.

The wiring layer 18 is a wiring pattern that fills the opening part 17x. A lower surface of the wiring layer 18 contacts the upper surface of the wiring layer 16 exposed in the opening part 17x. The wiring layer 18 is electrically connected to the wiring layer 16. The upper surface of the wiring layer 18 may be flush with, for example, the upper surface of the inorganic insulating layer 17. More specifically, the upper surface of the wiring layer 18 may be flush with, for example, the upper surface of the second inorganic insulating film 17b of the inorganic insulating layer 17. The material of the wiring layer 18 may be, for example, the same as the material of the wiring layer 14.

The inorganic insulating layer 19 is layered on the upper surface of the inorganic insulating layer 17 and the upper surface of the wiring layer 18. The inorganic insulating layer 19 includes an opening part (via hole) 19x. The upper surface of the wiring layer 18 is exposed in the opening part 19x. The inorganic insulating layer 19 may have a layered structure including a first inorganic insulating film 19a and a second inorganic insulating film 19b formed on the first inorganic insulating film 19a. The first and second inorganic insulating films 19a, 19b may have, for example, the same material and thickness as the material and the thickness of the first and second inorganic insulating films 13a, 13b.

The wiring layer 20 includes a via wiring that fills the opening part 19x and an electronic component mounting pad that is formed on the upper surface of the inorganic insulating layer 19. The wiring layer 20 may also include a wiring pattern. A bottom surface of the pad included in the wiring layer 20 contacts the upper surface of the wiring layer 18 exposed in the opening part 19x. The wiring layer 20 is electrically connected to the wiring layer 18. The pad included in the wiring layer 20 projects from the upper surface of the inorganic insulating layer 19. The material of the wiring layer 20 may be, for example, the same as the material of the wiring layer 14.

The metal layer 21 is formed on the upper surface of the wiring layer 20. The metal layer 21 may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order). It is, however, to be noted that the metal layer 21 may be formed according to necessity and may be omitted.

The inorganic insulating layer 25 is formed on the other surface 11g of the inorganic substrate 11. The inorganic insulating layer 25 may have a layered structure including a first inorganic insulating film 25a and a second inorganic insulating film 25b formed on the first inorganic insulating film 25a. The first inorganic insulating film 25a is formed to cover the other surface 11g of the inorganic substrate 11 and a side surface of a projecting part of the wiring layer 14 and expose a bottom surface of the projecting part of the wiring layer 14. The second inorganic insulating film 25b is formed on a lower surface of the first inorganic insulating film 25a. The second inorganic insulating film 25b includes an opening part 25x. A lower surface of the projecting part of the wiring layer 14 and the lower surface of the first inorganic insulating film 25a are exposed in the opening part 25x.

For example, a silicon oxide film (SiO$_2$ film) may be used as the material of the first inorganic insulating film 25a. For example, a silicon nitride film (SiN film) may be used as the material of the second inorganic insulating film 25b. The thickness of the first inorganic insulating film 25a may be, for example, approximately 1 µm. The thickness of the second inorganic insulating film 25b may be, for example, approximately 0.1 µm.

The wiring layer 26 is a wiring pattern that fills the opening part 25x. An upper surface of the wiring layer 26 contacts a lower surface of the projecting part of the wiring layer 14 exposed in the opening part 25x. The wiring layer 26 is electrically connected to the wiring layer 14. The lower surface of the wiring layer 26 may be flush with, for example, the lower surface of the inorganic insulating layer 25. More specifically, the lower surface of the wiring layer 26 may be flush with, for example, the lower surface of the second inorganic film 25b of the inorganic insulating layer 25. The material of the wiring layer 26 may be, for example, the same as the material of the wiring layer 14.

The organic insulating layer 27, which is layered on the lower surface of the inorganic insulating layer 25 and the lower surface of the wiring layer 26, is an outermost insulating layer of the interposer 1. The organic insulating layer 27 includes an opening part (via hole) 27x. The lower surface of the wiring layer 26 is exposed in the opening part 27x. For example, a photosensitive insulating resin having a thermal setting property (e.g., polyimide) may be used as the material of the organic insulating layer 27. The thickness of the organic insulating layer 27 may be, for example, approximately 3 µm.

The wiring layer 28 includes a via wiring that fills the opening part 27x and a pad that is formed on a lower surface of the organic insulating layer 27. An upper surface of the via wiring included in the wiring layer 28 contacts the lower surface of the wiring layer 26 exposed in the opening part 27x. The wiring layer 28 is electrically connected to the wiring layer 26. The pad included in the wiring layer 28 projects from the lower surface of the organic insulating layer 27. The material of the wiring layer 28 may be, for example, the same as the material of the wiring layer 14.

Next, the reinforcement member 3 according to an embodiment of the present invention is described. The reinforcement member 3 is a frame-like member provided on the wiring member 2 interposed by the adhesive part 4. The reinforcement member 3 is provided on a side of the one surface 11f of the wiring member 2. The reinforcement member 3 is provided on an outer edge of an area at which the wiring layer 20 is formed. The reinforcement member 3 has substantially the same layer configuration as the wiring member 2 and substantially the same thickness as the wiring member 2. That is, the reinforcement member 3 includes the inorganic substrate 11 along with the inorganic insulating layer 12, the inorganic insulating layer 13, the inorganic insulating layer 15, the inorganic insulating layer 17, and the inorganic insulating layer 19 provided on the side of the other surface 11f of the inorganic substrate 11. Thus, an inorganic insulating structure body including multiple inorganic insulating layers is provided on the side of the other surface 11f of the inorganic substrate 11. The reinforcement member 3 also includes the inorganic insulating layer 25 and the organic insulating layer 27 provided on the side of the one surface 11g of the inorganic substrate 11. It is, however, to be noted that the reinforcement member 3 does not include wiring layers that are to be used as via wirings, wiring patterns, pads, and the like.

Further, an opening part 3x is provided substantially at a center part of the reinforcement member 3. The opening part 3x is formed to penetrate the inorganic insulating layers 12, 13, 15, 17, 19, 25, and the organic insulating layer 27 of the reinforcement member 3. The wiring layer 20 and the metal layer 21 are exposed in the opening part 3x, so that the wiring layer 20 and the metal layer 21 can be used as pads for mounting an electronic component thereon. The inorganic and organic layers 12, 13, 15, 17, 19, 25, 27 included in the reinforcement member 3 and the inorganic and organic layers 12, 13, 15, 17, 19, 25, 27 included in the wiring member 2 are arranged symmetrically in a vertical direction with the adhesive part 4 centered between the wiring member 2 and the reinforcement member 3.

The reinforcement member 3 and the wiring member 2 are arranged, so that the other surface 11f of the inorganic substrate 11 of the reinforcement member 3 and the one surface 11f of the inorganic substrate 11 of the wiring member 2 face each other. In other words, the lower surface of the inorganic insulating layer 19 of the reinforcement member 3 is adhered to the upper surface of the inorganic insulating layer 19 of the wiring member 2 interposed by the adhesive part 4. For example, an epoxy type adhesive material having a thermal setting property may be used as the material of the adhesive part 4. The inorganic substrate 11 included in the reinforcement member 3 may also be hereinafter referred to as "second inorganic substrate".

<Method for Manufacturing Interposer of First Embodiment>

Next, a method for manufacturing an interposer according to the first embodiment of the present invention is described. FIGS. 2A-5B illustrate processes for manufacturing the interposer of the first embodiment. In this embodiment, parts corresponding to multiple interposers are manufactured by using a silicon wafer or the like and then the silicon wafer or the like is diced to obtain multiple individualized interposers. However, a single interposer may be manufactured. Further, glass such as borosilicate glass may be used instead of silicon for manufacturing the interposer.

Figure 2A:
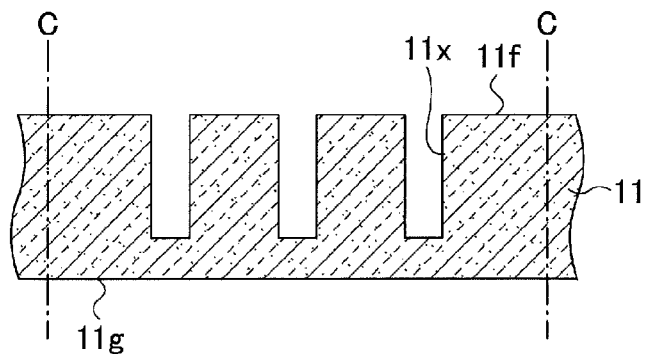
FIGS. 2A-2D illustrate processes for manufacturing the interposer of the first embodiment (part 1)

First, in the process illustrated in FIG. 2A, the inorganic substrate 11 is prepared. Then, a recess part(s) 11x is formed in the one surface 11f of the inorganic substrate 11. For example, a silicon wafer may be prepared as the inorganic substrate 11. The diameter of the silicon wafer may be, for example, 6 inches (approximately 150 mm), 8 inches (approximately 200 mm), or 12 inches (approximately 300 mm). In the case where the diameter of the silicon wafer is 6 inches, the thickness of the silicon wafer may be, for example, 0.625 mm. In the case where the diameter of the silicon wafer is 8 inches, the thickness of the silicon wafer may be, for example, 0.725 mm. In the case where the diameter of the silicon wafer is 12 inches, the thickness of the silicon wafer may be, for example, 0.775 mm. It is to be noted that the letter "C" of FIGS. 2A-5B indicates an area to be cut (diced) at a final process of dicing the inorganic substrate 11 (hereinafter also referred to as "dicing position C").

Then, the recess part 11x may be formed by, for example, forming resist on the one surface 11f of the inorganic substrate 11 in an area corresponding to the recess part 11x and etching the inorganic substrate 11 by using the resist as a mask. The etching is preferred to be performed by using an anisotropic etching method such as DRIE (Deep Reactive Ion Etching) using sulfur hexafluoride (SF$_6$). The plan-view shape of the recess part 11x may be, for example, a circular shape having a diameter of approximately 10 µm. The pitch between the recess parts 11x may be, for example, approximately 50 µm. The depth of the recess part 11x may be, for example, approximately 110 µm.

Figure 2B:
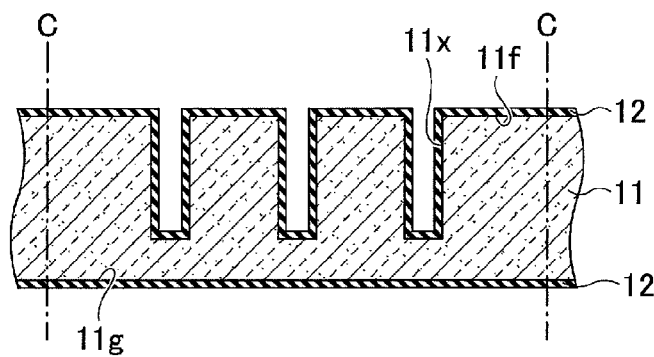

Then, in the process illustrated in FIG. 2B, the inorganic insulating layer 12 is formed on the one and the other surfaces 11f, 11g of the inorganic substrate 11, an inner wall surface of the recess part 11x, and an inner bottom surface of the recess part 11x. For example, a thermal oxide film (e.g., $SiO_2$ film) may be used as the inorganic insulating layer 12. The inorganic insulating layer 12 may be formed by thermally oxidizing the surface of the inorganic substrate 11 with a wet thermal oxidation method. In performing the wet thermal oxidation method, the vicinity of the surface of the inorganic substrate 11 is heated at a temperature of, for example, approximately 1100° C. The thickness of the inorganic insulating layer 12 may be, for example, approximately 1 μm.

Figure 2C:
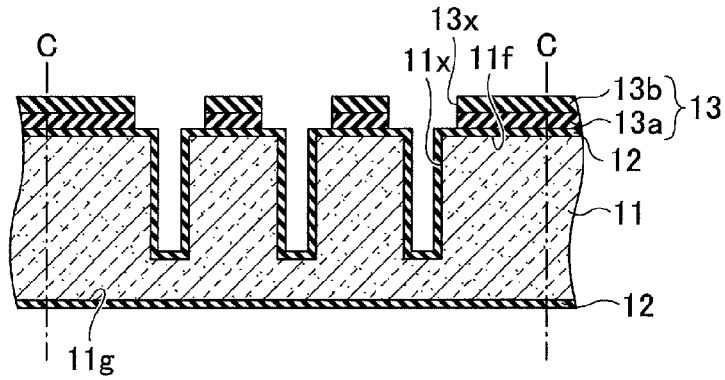

Then, in the process illustrated in FIG. 2C, the inorganic insulating layer 13, which includes the opening part 13x, is formed on the inorganic insulating layer 12 on the one surface 11f of the inorganic substrate 11. The inorganic insulating layer 13 may have a structure including the first inorganic film 13a and the second inorganic film 13b layered on the first inorganic film 13a. For example, a silicon nitride (SiN) film may be used as the material of the first inorganic insulating film 13a. For example, a silicon oxide ($SiO_2$) film may be used as the material of the second inorganic insulating film 13b. The thickness of the first inorganic insulating film 13a may be, for example, approximately 0.1 μm. The thickness of the second inorganic insulating film 13b may be, for example, approximately 0.1 μm.

The first and second inorganic insulating films 13a, 13b are sequentially formed on the inorganic insulating layer 12 on the one surface 11f and the recess part 11x of the inorganic substrate 11 by using, for example, a CVD (Chemical Vapor Deposition) method. The deposition temperature of the CVD method is, for example, approximately 400° C. Then, the recess part 13x may be formed by etching the first and second inorganic insulating films 13a, 13b by using a mask that exposes only an area at which the opening part 13x is to be formed. The opening part 13x may be formed to include the recess part 11x from a plan view (i.e., viewing the one surface 11f of the inorganic substrate 11 from a vertical direction).

Warping of the inorganic substrate 11 can be prevented by using the thermal oxide film ($SiO_2$ film) as the material of the inorganic insulating layer 12 and forming the inorganic insulating layer 13 having a two-layer structure that includes a silicon oxide film ($SiO_2$ film) layered on a silicon nitride film (SiN film). The reason that warping can be prevented is described below. Generally, in a case of forming a film, tensile stress (hereinafter indicated with a "+" sign) and compressive stress (hereinafter indicated with a "−" sign) are generated. Thus, in a case of forming the inorganic insulating layer 12 with the thermal oxide film ($SiO_2$ film), compressive stress of approximately −300 MPa is generated. Further, in a case where the first inorganic insulating film 13a is the silicon nitride film formed by a CVD method, tensile stress of approximately +140 MPa is generated. Further, in a case where the second inorganic insulating film 13b is the silicon oxide film ($SiO_2$ film) formed by a CVD method, compressive stress of approximately −110 MPa is generated. In a case where tensile stress is generated in a film, the film warps in a direction to form a concave shape. In a case where compressive stress is generated in a film, the film warps in a direction to form a convex shape. Therefore, by layering films that warp in opposite directions as described above, warping of the inorganic substrate 11 can be prevented. The stress that is generated in the films formed by the CVD method can be controlled by a film deposition apparatus or by adjusting film deposition conditions.

In a case where a silicon nitride film (SiN film) is used as the material of the first inorganic insulating film 13a and a silicon oxide film ($SiO_2$ film) is used as the material of the second inorganic insulating film 13b, each of the first and second inorganic insulating films 13a, 13b may be selectively etched by using separate etchants when forming the opening part 13x. For example, $CF_4$ and $O_2$ may be used as the etchants of the silicon nitride film (SiN film). For example, $CF_4$ may be used as the etchant of the silicon oxide film ($SiO_2$ film).

In this case, by using a thermal oxide film ($SiO_2$ film) as the inorganic insulating layer 12, the inorganic insulating layer 12 ($SiO_2$ film) becomes an etching stop layer during the etching of the first inorganic insulating film 13a formed by using an $SiO_2$ film. Therefore, the first and second inorganic insulating films 13a, 13b can be prevented from being over-etched, and the depth of the opening part 13x can be accurately defined. Accordingly, a wiring layer having a satisfactory flatness can be formed in the opening part 13x in a subsequent process.

Figure 2D:
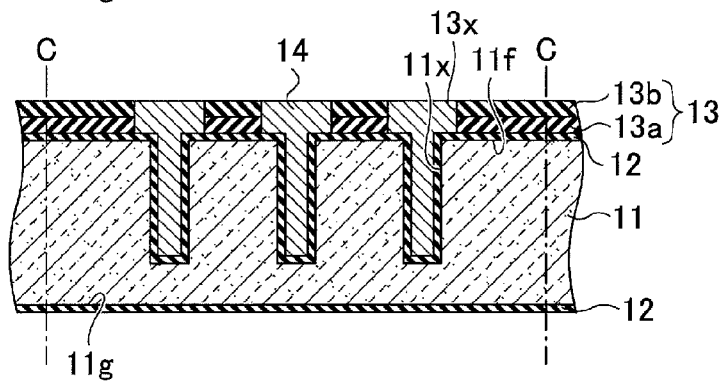

Then, in the process illustrated in FIG. 2D, the wiring layer 14 that fills the recess part 11x and the opening part 13x is formed. The wiring layer 14 is to be used as a through-wiring penetrating the inorganic substrate 11 and as a wiring pattern formed on the one side of the inorganic substrate 11. For example, in forming the wiring layer 14, a seed layer (not illustrated) is formed on the inorganic insulating layer 13 and on the inorganic insulating layer 12 exposed in the opening part 13x. The seed layer includes, for example, copper (Cu) or titanium (Ti). The seed layer is formed by, for example, an electroless plating method or a sputtering method.

Then, an electroplating layer is formed on the seed layer with an electroplating method using the seed layer as a power feeding layer. The electroplating layer includes, for example, a copper layer. Thereby, the seed layer and the electroplating layer are formed on the inorganic insulating layer 13 including the inorganic insulating layer 13 formed in the recess part 11x. Then, a CMP (Chemical Mechanical Polishing) method is performed to remove the seed layer and the electroplating layer except for the seed layer and the electroplating layer formed in the opening part 13x and the recess part 11x. Thereby, the wiring layer 14 including the seed layer and the electroplating layer is formed. The upper surface of the wiring layer 14 may be flush with, for example, the upper surface of the inorganic insulating layer 13. More specifically, the upper surface of the wiring layer 14 may be flush with the upper surface of the second inorganic insulating film 13b of the inorganic insulating layer 13.

Figure 3A:
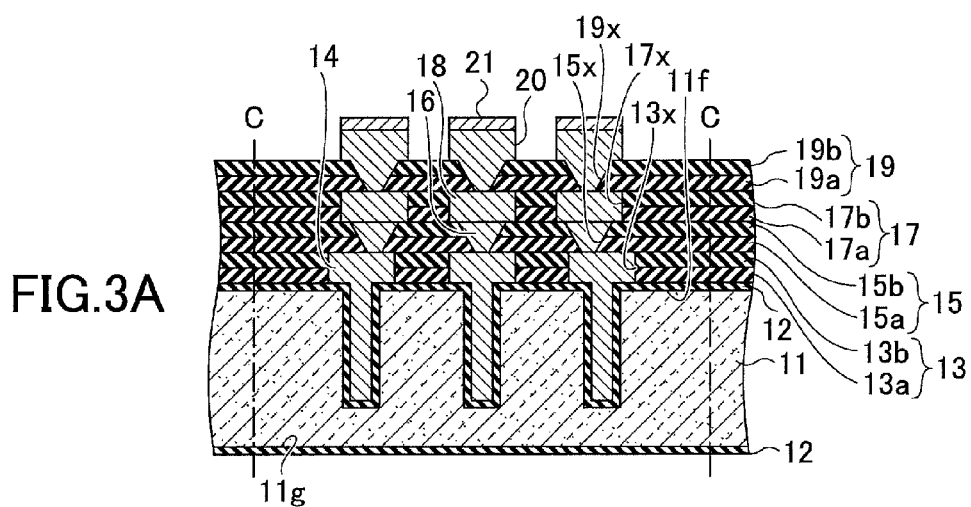
FIGS. 3A-3C illustrate processes for manufacturing the interposer of the first embodiment (part 2)

Then, in the process illustrated in FIG. 3A, a wiring structure body is formed by sequentially layering the inorganic insulating layers 13, 15, 17, 19 and the wiring layers 16, 18, 20. For example, similar to the process illustrated in FIG. 2C, the inorganic insulating layer 15 including the opening part 15x is formed on the upper surface of the inorganic insulating layer 13 and the upper surface of the wiring layer 14. Then, similar to the process illustrated in FIG. 2D, the wiring layer 16 that is used as the via wiring is formed. The inorganic insulating layer 15 may have a structure including the first inorganic film 15a and the second inorganic film 15b layered on the first inorganic film 15a. The first and second inorganic insulating films 15a, 15b may have, for example, the same material and thickness as the material and the thickness of the first and second inorganic insulating films 13a, 13b. The first and second inorganic insulating films 15a, 15b may be formed by using, for example, the same deposition method as the deposition method used for the first and second inorganic insulating films 13a, 13b. The upper surface of the wiring layer 16 may be flush with, for example, the upper surface of the inorganic insulating layer 15. More specifically, the upper surface of the wiring layer 16 may be flush with the upper surface of the second inorganic insulating film 15b of the inorganic insulating layer 15.

Warping of the inorganic substrate 11 can be prevented by forming the inorganic insulating layer 15 having a two-layer structure that includes a silicon oxide film (SiO$_2$ film) layered on a silicon nitride film (SiN film). As described above, the warping can be prevented because the tensile stress generated in the silicon nitride film (SiN film) and the compressive stress generated in the silicon oxide film (SiO$_2$ film) are offset (countervailed) by each other. The prevention of warping also applies to the below-described inorganic insulating layers 17, 19, 25.

Then, for example, similar to the process illustrated in FIG. 2C, the inorganic insulating layer 17 including the opening part 17x is formed on the upper surface of the inorganic insulating layer 15 and the upper surface of the wiring layer 16. Then, similar to the process illustrated in FIG. 2D, the wiring layer 18 that is used as the wiring pattern is formed. The inorganic insulating layer 17 may have a structure including the first inorganic film 17a and the second inorganic film 17b layered on the first inorganic film 17a. The first and second inorganic insulating films 17a, 17b may have, for example, the same material and thickness as the material and the thickness of the first and second inorganic insulating films 13a, 13b. The first and second inorganic insulating films 17a, 17b may be formed by using, for example, the same deposition method as the deposition method used for the first and second inorganic insulating films 13a, 13b. The upper surface of the wiring layer 18 may be flush with, for example, the upper surface of the inorganic insulating layer 17. More specifically, the upper surface of the wiring layer 18 may be flush with the upper surface of the second inorganic insulating film 17b of the inorganic insulating layer 17.

Then, for example, similar to the process illustrated in FIG. 2C, the inorganic insulating layer 19 including the opening part 19x is formed on the upper surface of the inorganic insulating layer 17 and the upper surface of the wiring layer 18. Then, the wiring layer 20 that is used as the wiring pattern and the pad is formed in the opening part 19x and the upper surface of the inorganic insulating layer 19. The wiring layer 20 may be formed into, for example, a circular shape from a plan view. The inorganic insulating layer 19 may have a structure including the first inorganic film 19a and the second inorganic film 19b layered on the first inorganic film 19a. The first and second inorganic insulating films 19a, 19b may have, for example, the same material and thickness as the material and the thickness of the first and second inorganic insulating films 13a, 13b. The first and second inorganic insulating films 19a, 19b may be formed by using, for example, the same deposition method as the deposition method used for the first and second inorganic insulating films 13a, 13b.

For example, in forming the wiring layer 20, seed layers (not illustrated) are successively formed on the upper surface of the inorganic insulating layer 19, an inner side surface of the opening part 19x, the upper surface of the wiring layer 18. The seed layer includes, for example, copper (Cu) or titanium (Ti). The seed layer is formed by, for example, an electroless plating method or a sputtering method. Then, resist is formed on the seed layer to expose only the area at which the wiring layer 20 is to be formed.

Then, an electroplating layer is formed on an exposed part of the seed layer that is not covered by the resist. The electroplating layer is formed with an electroplating method using the seed layer as a power feeding layer. The electroplating layer includes, for example, a copper layer. Thereby, the seed layer and the electroplating layer are layered in exposed areas that are not covered by the resist. Then, the resist is removed. Further, a part of the seed layer that is not covered by the electroplating layer is removed. Thereby, the wiring layer 20 including the seed layer and the electroplating layer is formed. The upper and side surfaces of the wiring layer 20 are exposed from the inorganic insulating layer 19.

According to necessity, the metal layer 21 may be formed on the wiring layer 20. The metal layer 21 may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

Figure 3B:
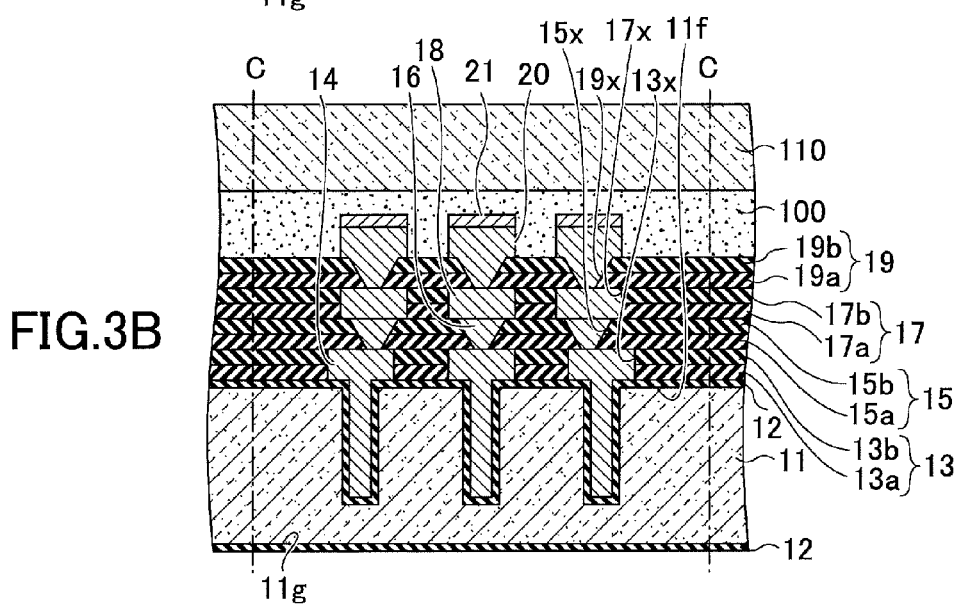

Then, in the process illustrated in FIG. 3B, a support 110 is temporarily adhered to the inorganic insulating layer 19 interposed by an adhesive material 100. The adhesive material 100 is preferred to be a material that can be easily separated in a subsequent process. For example, an olefin adhesive that is soluble in a solvent may be used as the adhesive material 100. The support 110 may be, for example, a silicon wafer. From the standpoint of reducing the warping of the structure body illustrated in FIG. 3B, the thickness of the support 110 is preferred to be substantially the same as the thickness of the inorganic substrate 11.

Figure 3C:
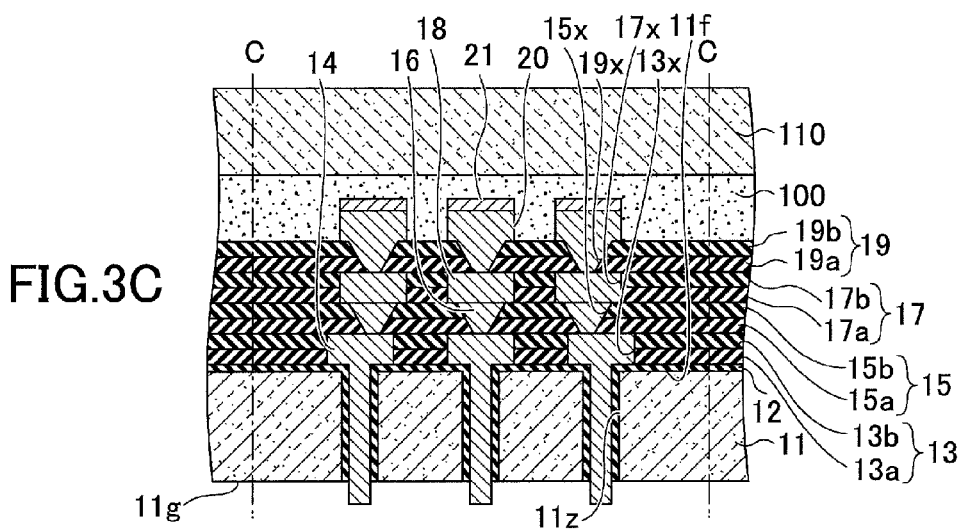

Then, in the process illustrated in FIG. 3C, the side of the other surface 11g of the inorganic substrate 11 is polished by using, for example, a grinder. The thickness of the inorganic substrate 11 is reduced by the polishing until the thickness of the inorganic substrate 11 becomes approximately 110 µm. Then, the side of the other surface 11g of the inorganic substrate 11 is etched for approximately 10 µm. Because the wiring layer 14 is not etched in this process, a tip part of the wiring layer 14 projects approximately 10 µm from the other surface 11g of the inorganic substrate 11.

Figure 4A:
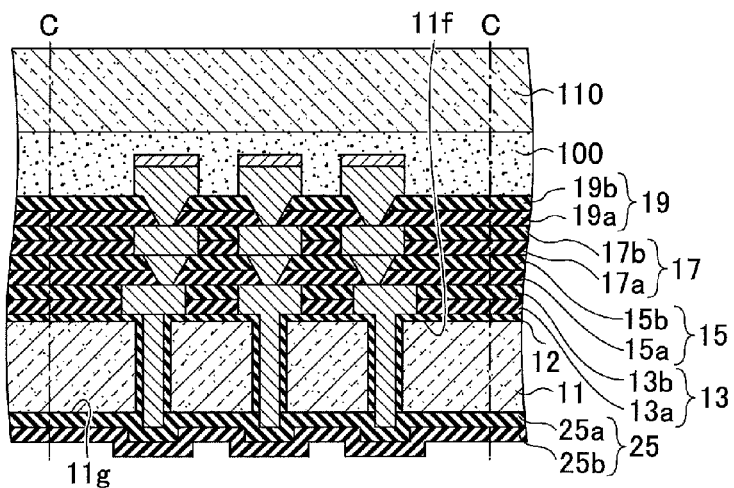
FIGS. 4A-4C illustrate processes for manufacturing the interposer of the first embodiment (part 3)

Then, in the process illustrated in FIG. 4A, the inorganic insulating layer 25 is formed on the other surface 11g of the inorganic substrate 11 by sequentially layering the first and second inorganic insulating films 25a, 25b to cover the projecting part of the wiring layer 14.

The first and second inorganic insulating films 25a, 25b may be sequentially formed by, for example, a CVD method. The deposition temperature of the CVD method is, for example, approximately 200° C. Because the heat-resistance of the adhesive material 100 is approximately 200° C., it is difficult to perform the CVD method with a deposition temperature higher than 200° C. Therefore, the CVD method is to be performed with a deposition temperature of approximately 200° C.

For example, a silicon oxide film (SiO$_2$ film) may be used as the material of the first inorganic insulating film 25a. For example, a silicon nitride film (SiN film) may be used as the material of the second inorganic insulating film 25b. The thickness of the first inorganic insulating film 25a may be, for example, approximately 1 µm. The thickness of the second inorganic insulating film 25b may be, for example, approximately 0.1 µm.

Figure 4B:
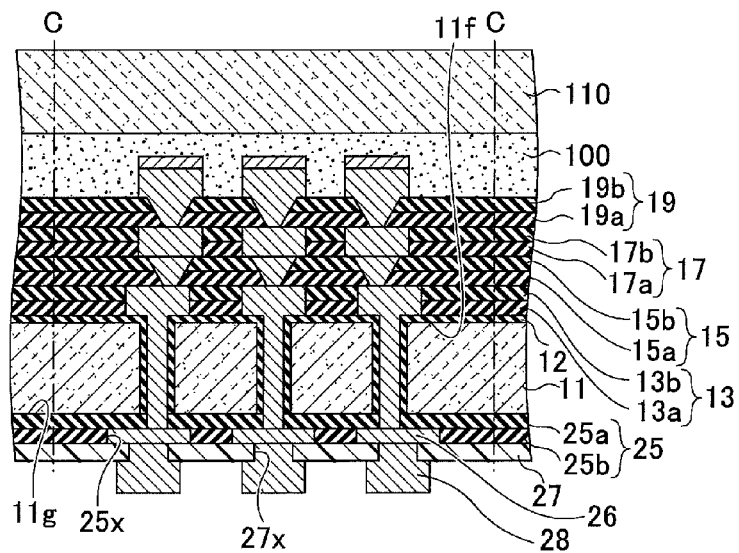

Then, in FIG. 4B, the wiring layer 26, the organic insulating layer 27, and the wiring layer 28 are formed. For example, after flattening the second inorganic insulating film 25b by using, for example, a CMP method, the first and second inorganic insulating films 25a, 25b are etched by using a predetermined mask. Thereby, the opening part 25x is formed. Then, similar to the process illustrated in FIG. 2D, the wiring layer 26 that is used as the wiring pattern is formed. The lower surface of the wiring layer 26 may be flush with, for example, the lower surface of the inorganic insulating layer 25. More specifically, the lower surface of the wiring layer 26 may be flush with the lower surface of the second inorganic insulating film 25b of the inorganic insulating layer 25.

Then, the organic insulating layer 27 including the opening part 27x is formed on the lower surface of the inorganic insulating layer 25 and the lower surface of the wiring layer 26. For example, the opening part 27x is formed by applying or laminating a photosensitive insulating resin having a thermosetting property (e.g., polyimide) on the lower surface of the inorganic insulating layer 25 and the lower surface of the wiring layer 26 and exposing and developing the applied or laminated photosensitive insulating resin. Then, the photosensitive insulating resin is cured by heating the photosensitive insulating resin to a predetermined thermosetting temperature. Thereby, the organic insulating layer 27 is formed. The thickness of the organic insulating layer 27 may be, for example, approximately 3 μm. Then, similar to the process of forming the wiring layer 20 in FIG. 3A, the wiring layer 28 to be used as the external connection pad is formed in the opening part 27x and the lower surface of the organic insulating layer 27.

The first reason for forming the organic insulating layer 27 on the lower surface of the inorganic insulating layer 25 and the lower surface of the wiring layer 26 is because the organic insulating layer 27 is not required to be heated to a high temperature. That is, in this embodiment, because the thickness of the inorganic substrate 11 is reduced to approximately 100 μm, it is difficult to handle only the thin inorganic substrate 11 in a subsequent process. Therefore, the inorganic substrate 11 is reinforced by temporarily fixing the support 110 to the inorganic substrate 11 interposed by the adhesive material 100. However, because it is difficult to select a material having high heat resistance as the adhesive material 100, a material having low heat resistance (e.g., a material having heat resistance of approximately 200° C.) is selected as the adhesive material 100.

Therefore, a process that is performed after temporarily fixing the support 110 to the inorganic substrate 11 is to be performed at a temperature equal to or less than the heat resistance of the adhesive material 100. Thus, a process of forming the organic insulating layer 27 having a heat resistance equal to or lower than the heat resistance of the adhesive material 100 is formed instead of forming, for example, a silicon oxide film with a CVD method at a temperature (e.g., 400° C.) higher than the heat resistance of the adhesive material.

In the process illustrated in FIG. 4A, the inorganic insulating layer 25 is formed with a CVD method at a low film deposition temperature of approximately 200° C. Therefore, forming a film having a satisfactory insulating property is difficult compared to a case of forming an inorganic insulating layer with a CVD method at a temperature of approximately 400° C. Because it is not preferable to form a layered structure of multiple inorganic insulating layers with the CVD method at such a low temperature, a layered structure including multiple inorganic insulating layers is not formed on the side of the other surface 11g of the inorganic substrate 11. Instead, the organic insulating layer 27 is provided on the side of the other surface 11g of the inorganic substrate 11 because it is easy to select a material (e.g., polyimide) that is curable at a temperature equal to or lower than the heat resistance of the adhesive material 100 as the organic insulating layer 27 and because satisfactory insulating property can be attained.

The second reason for forming the organic insulating layer 27 on the lower surface of the inorganic insulating layer 25 and the lower surface of the wiring layer 26 is because the thermal expansion coefficient of the entire interposer 1 is to be increased. The thermal expansion coefficient of the interposer 1 that uses silicon as its inorganic substrate 11 becomes substantially equivalent to the thermal expansion coefficient of the electronic component (e.g., MEMS device, semiconductor device) in a case where the organic insulating layer 27 is not formed. In this case where no organic insulating layer 27 is formed, the interposer 1 is mounted on an organic wiring substrate by way of the interposer 1, and an underfill resin is formed to cover a bonding part between the interposer 1 and the organic wiring substrate. When the underfill resin is thermally cured, the underfill resins shrinks and causes the organic wiring substrate to warp. This is due to the large difference between the thermal expansion coefficient of the interposer 1 having no organic insulating layer 27 and the thermal expansion coefficient of the organic wiring substrate.

By providing the organic insulating layer 27 on the lower surface of the inorganic insulating layer 25 and the lower surface of the wiring layer 26, the thermal expansion coefficient of the entire interposer 1 can be increased. Accordingly, the difference between the thermal expansion coefficient of the interposer 1 and the thermal expansion coefficient of the organic wiring substrate can be reduced. Thus, the amount of warping of the organic wiring substrate during the thermal curing of the underfill resin can be reduced. As a result, stress applied to the bonding part between the interposer 1 and the organic wiring substrate can be reduced. Accordingly, the reliability of the connection between the interposer 1 and the organic wiring substrate can be improved.

Figure 4C:
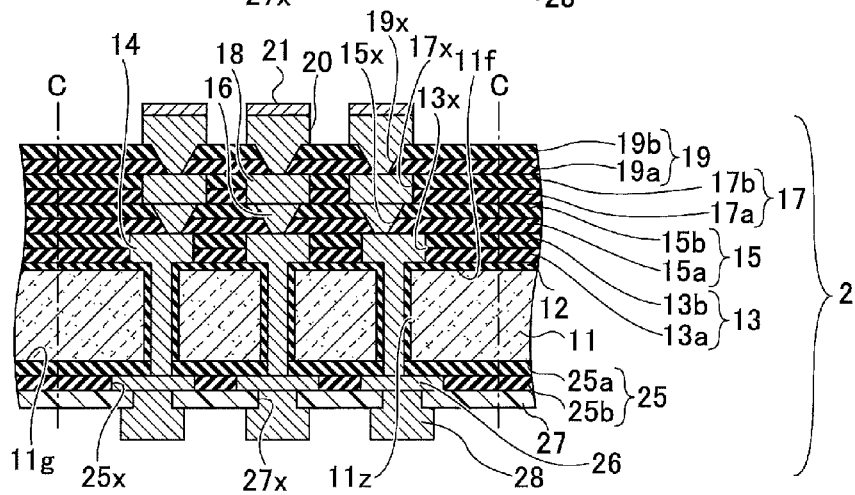

Then, in the process illustrated in FIG. 4C, the adhesive material 100 and the support 110 are removed. In a case where an olefin adhesive is used as the adhesive material 100, the support 110 can be removed by dissolving the adhesive material 100 with a predetermined solvent. Thereby, the manufacturing of the wiring member 2 is completed. In this state, the warping of the wiring member 2 is large because the number of layers, the layer configuration, and the thermal history are different between the side of the one surface 11f of the inorganic substrate 11 and the side of the other surface 11g of the inorganic substrate 11 (see below-described examples).

Then, in the process illustrated in FIG. 5A, the reinforcement member 3 is formed by performing the same process as that for manufacturing the wiring member 2. Thereby, the reinforcement member 3 is formed having the same layer configuration as that of the wiring member 2. The thicknesses of the wiring substrate and the insulating layers included in the reinforcement member 3 are the same as the thicknesses of the wiring substrate and the insulating layers included in the wiring member 2. However, unlike the wiring member 2, the reinforcement member 3 has no wiring layer such as a via wiring, a wiring pattern, or a pad. In forming the reinforcement member 3, first, a silicon wafer or the like having a predetermined shaped is prepared as the inorganic substrate 11 similar to the process illustrated in FIG. 2A. Then, similar to the process illustrated in FIG. 2C, the inorganic insulating layer 13 is formed on the other surface 11f of the inorganic substrate 11 by layering the first and second inorganic insulating films 13a, 13b thereon. Then, similar to the process illustrated in FIG. 3A, the inorganic insulating layer 15, the inorganic insulating layer 17, and the inorganic insulating layer 19 are sequentially formed on the inorganic insulating layer 13.

Then, similar to the processes illustrated in FIGS. 3B and 3C, the thickness of the inorganic substrate 11 is reduced to approximately 100 μm. Then, similar to the process illustrated in FIG. 4A, the inorganic insulating layer 25 is formed on the one surface 11g of the inorganic substrate 11. Then, similar to the process illustrated in FIG. 4B, the organic insulating layer 27 is layered on the inorganic insulating layer 25. Then, similar to the process illustrated in FIG. 4C, the adhesive material 100 and the support 110 are removed.

Further, the opening part 3x is formed by using a wet-etching method or a dry-etching method, to remove corresponding parts of the inorganic substrate 11, the inorganic insulating layers 13, 15, 17, 19 that are formed on the side of the other surface 11f of the inorganic substrate 11, and corresponding parts of the inorganic insulating layer 25 and the organic insulating layer 27 that are formed on the side of the one surface 11g of the inorganic substrate 11. Thereby, the manufacturing of the reinforcement member 3 is completed. The reinforcement member 3 has a frame-like shape from a plan view. Further, the reinforcement member 3 has the same layer configuration as the layer configuration of the wiring member 2 and the same thickness as the thickness of the wiring member 2.

Then, in the process illustrated in FIG. 5B, the reinforcement member 3 is adhered to the wiring member 2 interposed by the adhesive part 4. For example, the reinforcement member 3 may be flipped upside down and positioned above the wiring member 2 as illustrated in the cross-sectional view of FIG. 5B. Then, the adhesive part 4 may be adhered to the lower surface of the reinforcement member 3. For example, an epoxy type adhesive having a thermosetting property may be used as the material of the adhesive part 4. Then, the reinforcement member 4 is placed on the wiring member 2 interposed by the adhesive part 4. In this state, the adhesive part 4 is cured at a predetermined temperature. Thereby, the reinforcement member 3 is adhered on the wiring member 2 interposed by the adhesive part 4. Alternatively, an adhesive material having an ultra-violet curable property may be used as the adhesive part 4.

Then, the structure body that includes the reinforcement member 3 adhered to the wiring member 2 interposed by the adhesive part is diced at the dicing position C by using, for example, a dicer. Thereby, manufacturing of multiple singulated (individual) interposers 1 is completed. Alternatively, the interposer 1 may be formed as follows. First, the reinforcement member 3 and the wiring member 2 are separately diced at the dicing position C by using, for example, a dicer. Thereby, multiple singulated reinforcement members 3 and wiring members 2 are obtained. Then, the adhesive part 4 is adhered to the lower surface of each of the reinforcement members 3. Then, each of the reinforcement members 3 is placed on a corresponding wiring member 2. Then, in this state, the adhesive part 4 is cured at a predetermined temperature. Thereby, the reinforcement member 3 is adhered to the corresponding wiring member 2 interposed by the adhesive part 4.

Accordingly, in this embodiment, the reinforcement member 3 is formed by performing the processes similar to the processes for forming the wiring member 2. The reinforcement member 3 is formed having the same layer configuration as the layer configuration of the wiring member 2 and the same thickness as the thickness of the wiring member 2. Because the reinforcement member 3 and the wiring member 2 have, for example, the same physical properties and thermal history, the reinforcement member 3 and the wiring member 2 tend to exhibit the same warping behavior. Therefore, the wiring member 2 and the reinforcement member 3 can be made to warp in opposite directions (warping in countervailing directions) by layering the reinforcement member 3 on the wiring member 2, so that the reinforcement member 3 and the wiring member 2 are arranged symmetrically in a vertical direction with the adhesive part 4 centered therebetween. As a result, warping of the entire interposer 1 can be prevented.

In this embodiment, a wiring structure body including multiple layers (inorganic insulating layers 13, 15, 17, 19, and wiring layers 16, 18, 20) is formed on the one surface 11f of the inorganic substrate 11 of the wiring member 2. A high density wiring pattern (e.g., a wiring pattern having a line/space of 1 μm/1 μm) corresponding to the narrow pitch of electronic components (e.g., MEMS devices, semiconductor devices) mounted on the interposer 1 can be formed without having to form a narrow-pitched through-wiring (through-hole 11z).

Examples

According to an example of the present invention, a sample of the interposer 1 illustrated in FIG. 1 was manufactured, and the warping amount of the interposer 1 was measured. As a first comparative example, a sample having no reinforcement member 3 (no frame) was manufactured. That is, the sample of the first comparative example only includes the wiring member 2 of FIG. 1. Likewise, the warping amount of the first comparative example was measured. Further, as a second comparative example, a sample was manufactured by replacing the reinforcement member 3 of FIG. 1 with a silicon substrate having silicon oxide films formed on its surfaces (silicon frame only). That is, the sample of the second comparative example is provided with a reinforcement member that only includes the inorganic substrate 11, the inorganic insulating layer 12, and the first inorganic insulating film 25a. Likewise, the warping amount of the second comparative example was measured.

It is to be noted that, the wiring members 2 included in all of the samples of the first and second comparative examples and the sample of the example of the present invention were formed with the same material, the same layer configuration, and the same layer thickness. Further, the inorganic substrate 11, the inorganic insulating layer 12, and the first inorganic insulating film 25a included in each sample of the reinforcement members of the example and the second comparative example were formed with the same material, the same shape, and the same thickness. The results of measuring the warping amounts of the first comparative example, the second comparative example, and the example of the present invention are illustrated in a table of FIG. 6.

As illustrated in the table of FIG. 6, in the case of the first comparative example including only the wiring member 2 of FIG. 1 (i.e. without the reinforcement member 3), the warping amount was 195 μm. In the case of the second comparative example replaced with a silicon substrate having silicon oxide films formed on its surfaces (i.e. reinforcement member only including the inorganic substrate 11, the inorganic insulating layer 12, and the first inorganic insulating film 25a), the warping amount was 147 μm.

On the other hand, in the case of the example of the interposer 1 of FIG. 1, the warping amount was 100 μm. Therefore, compared to the warping amounts of the first and second comparative examples, a significant improvement of the warping amount was confirmed. It was confirmed that warping of the entire interposer 1 can be prevented because the wiring member 2 and the reinforcement member 3 can be made to warp in opposite directions (warping in countervailing directions) by layering the reinforcement member 3 on the wiring member 2, so that the reinforcement member 3 and the wiring member 2 are arranged symmetrically in a vertical direction with the adhesive part 4 centered therebetween.

<Modified Example of First Embodiment>

In the modified example of the first embodiment, the reinforcement member 3 is constituted by multiple parts. In the modified example of the first embodiment, like components are denoted with like reference numerals as those of the first embodiment and are not further explained.

Figure 7A:
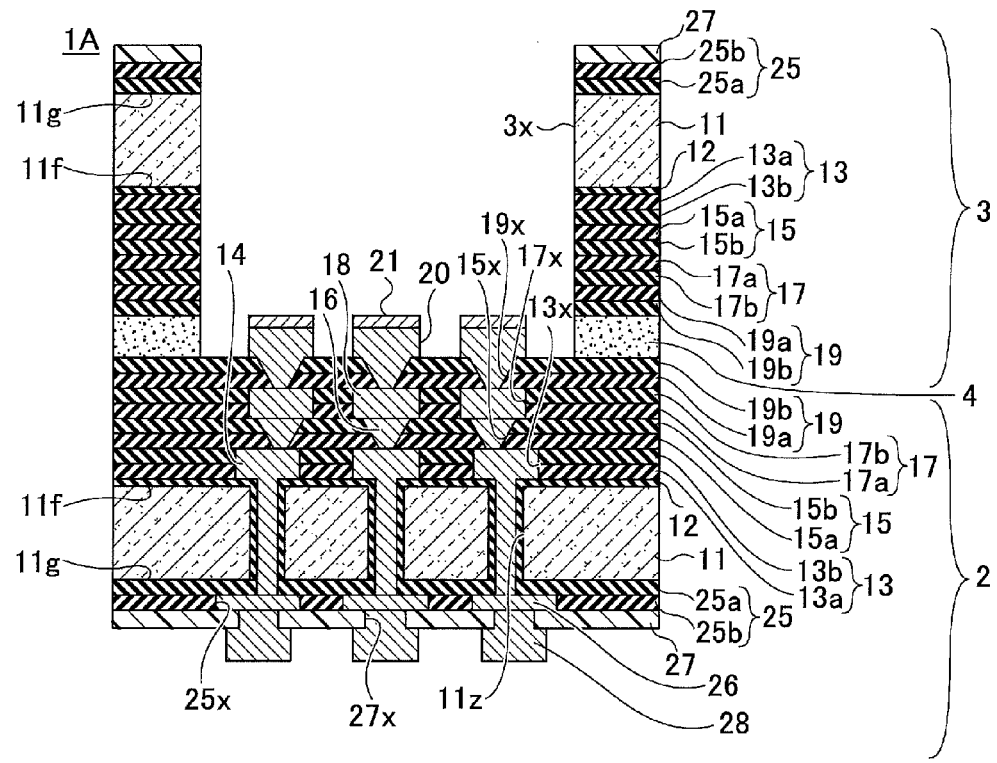
FIG. 7A is a cross-sectional view illustrating an interposer of according to a modified example of the first embodiment.
Figure 7B:
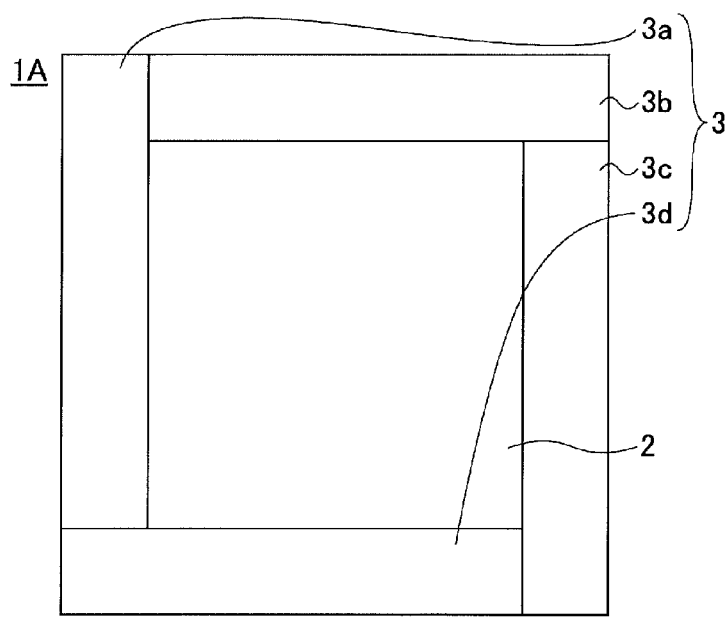
FIG. 7B is a plan view illustrating the interposer of the modified example of the first embodiment.

FIGS. 7A and 7B are schematic diagrams illustrating an interposer 1A according to the modified example of the first embodiment. FIG. 7A is a cross-sectional view illustrating the interposer 1A of the modified example, and FIG. 7B is a plan view illustrating the interposer 1A of the modified example. As illustrated in FIG. 7A, the structure of the cross-section of the interposer 1A is the same as the structure of the cross-section of the interposer 1. However, as illustrated in FIG. 7B, the interposer 1A is different from the interposer 1 (see FIG. 1B) in that multiple parts 3a, 3b, 3c, 3d constitute the reinforcement member 3.

Each of the parts 3a, 3b, 3c, 3d is a flat-shaped member. After forming a layered structure body including the above-described layers of FIG. 1A formed on the upper and lower surfaces of the inorganic substrate 11, the layered structure body is divided in a thickness direction (layering direction). Thereby, the parts 3a, 3b, 3c, 3d can be obtained. An adhesive material or the like (not illustrated) is used to attach adjacent ends of the parts 3a, 3b, 3c, 3d, so that the parts 3a, 3b, 3c, 3d form L-shapes from a plan view. Thereby, the parts 3a, 3b, 3c, 3d, as a whole, form a frame-like reinforcement member 3.

By forming the reinforcement member 3 from the multiple parts 3a, 3b, 3c, 3d, the material for forming the reinforcement member 3 can be used more efficiently compared to providing the opening part 3x that penetrates the layered structure body including the inorganic substrate 11. That is, with the structure of the reinforcement member 3 of FIG. 1B, an inside material corresponding to the opening part 3x is to be discarded in order to form the opening part 3x. On the other hand, with the structure of the reinforcement member of FIG. 7B, such discarding can be avoided. As a result, cost reduction of the interposer 1A can be achieved.

Second Embodiment

An electronic component package 1B including an electronic component (e.g., MEMS device, semiconductor device) mounted on the interposer 1 according to the second embodiment of the present invention is described. In the second embodiment, like components are denoted with like reference numerals as those of the first embodiment and are not further explained.

Figure 8A:
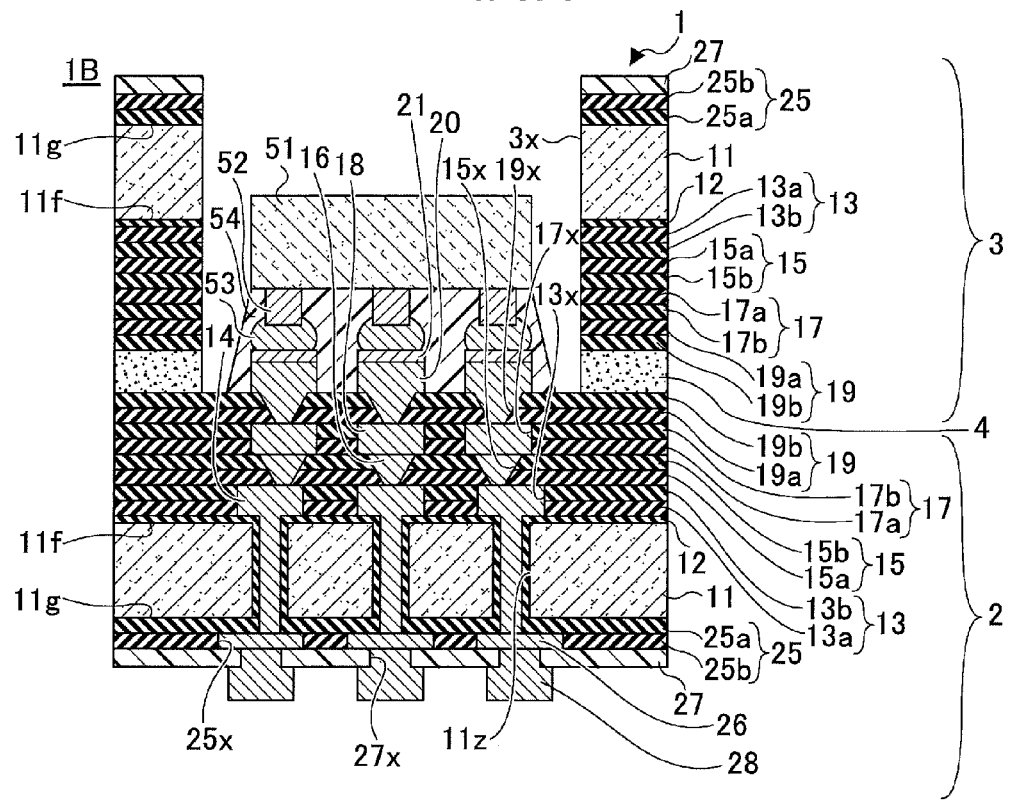
FIG. 8A is a cross-sectional view illustrating an electronic component package according to a second embodiment of the present invention.
Figure 8B:
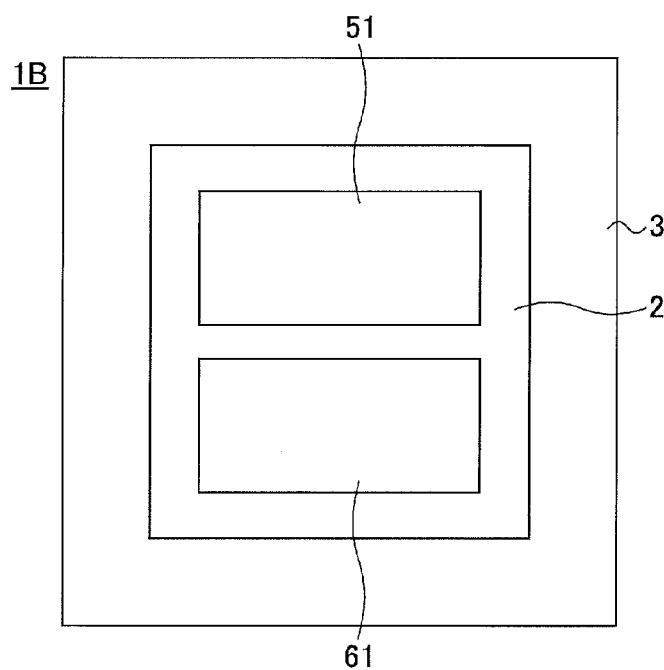
FIG. 8B is a plan view illustrating the electronic component package of the second embodiment.

FIG. 8A is a cross-sectional view illustrating an electronic component package 1B of the second embodiment. FIG. 8B is a plan view illustrating the electronic component package 1B of the second embodiment.

With reference to FIGS. 8A and 8B, the electronic component package 1B includes the interposer 1, electronic components (e.g., MEMS device, semiconductor device) 51, 61, a projecting electrode 52, a bonding part 53, and an underfill resin 54. It is to be noted that, although two electronic components are mounted on the interposer 1 in this embodiment, a single electronic component or three or more electronic components may be mounted on the interposer 1. In a case of mounting multiple electronic components on the interposer 1, the functions of the multiple electronic components may be the same or different from each other.

The electronic component 51 is mounted on the wiring member 2 of the interposer 1 and provided in the opening part 3x of the reinforcement member 3. More specifically, the projecting electrode 52 is provided on the side of the lower surface of the electronic component 51. The projecting electrode 52 may be, for example, a copper pillar or a gold bump.

The projecting electrode 52 is electrically connected to the metal layer 21 of the wiring member 2 interposed by the bonding part 53. The material of the bonding part 53 may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu). For example, a conductive paste such as a silver paste may be used as the bonding part 53. The underfill resin 54 is provided on the wiring member 2 to cover the projecting electrode 52 and the bonding part 53.

Similar to the electronic component 51, the electronic component 61 is also mounted on the wiring member 2 of the interposer 1 and provided in the opening part 3x of the reinforcement member 3. The electronic component 51 and the electronic component 61 can be electrically connected to each other by way of a predetermined wiring layer formed in the wiring member 2.

Accordingly, the electronic component package 1B can have the electronic components 51, 61 mounted on the interposer 1. Because the warping amount of the interposer 1 can be reduced, the electronic components 51, 61 can be easily mounted on the interposer 1. Further, because the warping amount of the interposer 1 can be reduced, the connection reliability between the wiring member 2 and the electronic components 51, 61 can be improved.

Further, because silicon is used as the inorganic substrate 11 of the wiring member 2, each wiring layer can be formed on the inorganic substrate 11 with high density in a semiconductor manufacturing process. Accordingly, high density wiring patterns can be formed without having to form narrow-pitched through-wirings (through-holes 11z). As a result, the electronic components 51, 61 including, for example, narrow-pitched projecting electrodes can be mounted on the interposer 1.

Third Embodiment

An organic wiring substrate 70 on which is mounted the electronic component package 1B according to the third embodiment of the present invention is described. In the third embodiment, like components are denoted with like reference numerals as those of the first embodiment and are not further explained.

Figure 9:
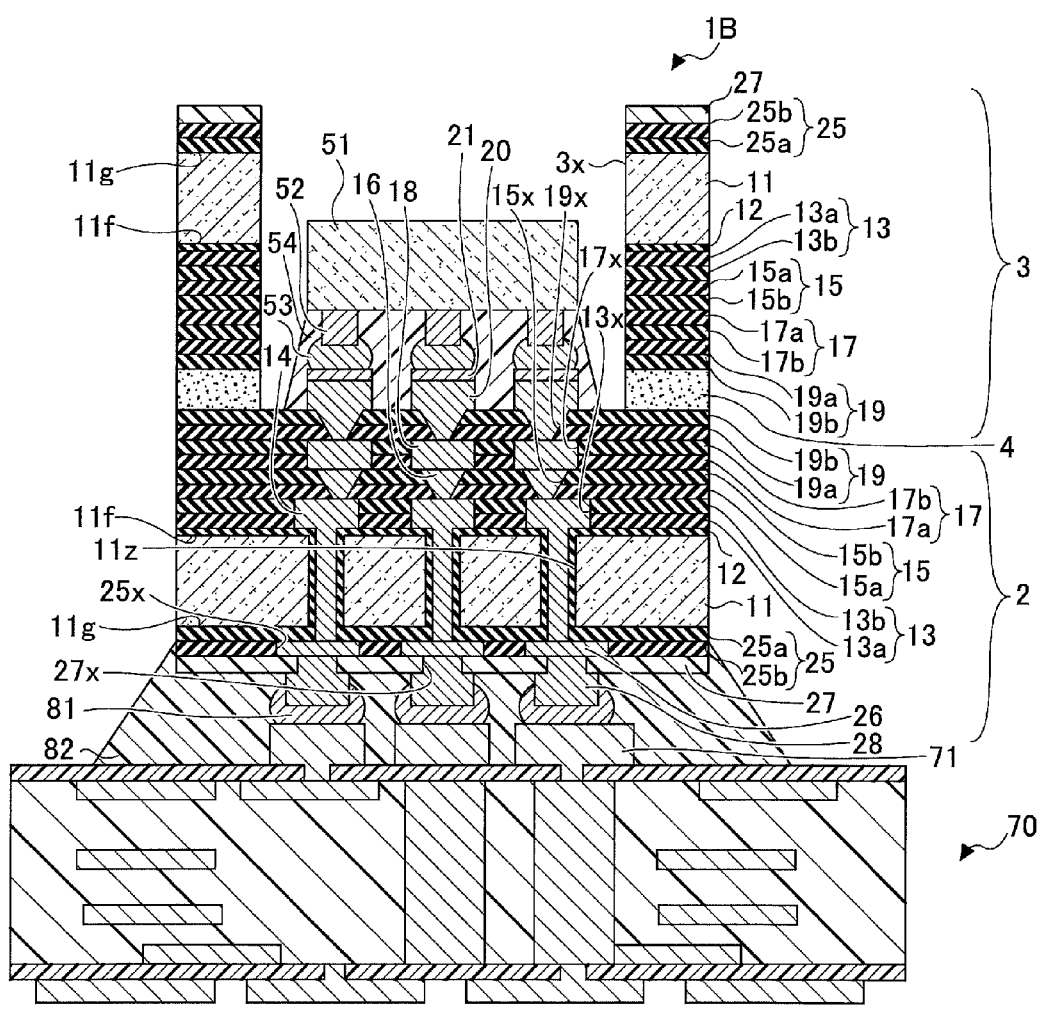
FIG. 9 is a cross-sectional view illustrating an organic wiring substrate on which is mounted the electronic component package of the second embodiment.

FIG. 9 illustrates a state where the electronic component package 1B of the second embodiment is mounted on the organic wiring substrate 70.

With reference to FIG. 9, the electronic component package 1B is mounted on the organic wiring substrate 70. For example, the organic wiring substrate 70 may be a built-up wiring substrate including organic insulating resin layers and wiring layers alternately layered one on top of the other and having predetermined wiring layers electrically connected to each other by a via wiring penetrating predetermined organic insulating layers. A pad 71 is formed on the one surface of the organic wiring substrate 70.

In the semiconductor package 1B, the wiring layer 28 of the wiring member 2 is electrically connected to the pad 71 of the organic wiring substrate 70 interposed by a bonding part 81. The material of the bonding part 81 may be a solder material including, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu). For example, a conductive paste such as a silver paste may be used as the bonding part 81. An underfill resin 82 is provided on the one surface of the organic wiring substrate 70 to cover the wiring layer 28 and the bonding part 81.

Accordingly, the electronic component package 1B may be mounted on the organic wiring substrate 70. In the interposer 1 of the electronic component package 1B, the organic insulating layer 27 is provided as the outermost layer of the wiring member 2. Therefore, compared to a conventional interposer where a wiring member is formed only of an inorganic material, the thermal expansion coefficient of the entire interposer 1 can be increased.

Accordingly, the difference between the thermal expansion coefficient of the organic wiring substrate 70 and the thermal expansion coefficient of the interposer 1 can be reduced compared to the difference between the thermal expansion coefficient of the organic wiring substrate 70 and the thermal expansion coefficient of the conventional interposer where its wiring member is formed only of an inorganic material. Therefore, in a case of mounting the electronic component package 1B on the organic wiring substrate 70, forming the underfill resin 82 that covers, for example, the bonding part 81, and thermally curing the underfill resin 82, the amount of warping of the organic wiring substrate 70 caused by the shrinkage of the underfill resin 82 can be reduced. As a result, stress applied to the bonding part 81 can be reduced. Thus, connection reliability between the wiring member 2 of the electronic component package 1B and the organic wiring substrate 70 can be improved.

Various aspects of the subject-matter described herein are set out non-exhaustively in the following numbered clauses:

1. A method for manufacturing an interposer comprising:
   forming a wiring member including a first inorganic substrate;
   forming a reinforcement member including a second inorganic substrate; and
   forming an adhesive part interposed between the wiring member and the reinforcement member;
   wherein the first inorganic substrate includes a first surface on a side toward the adhesive part and a second surface on a side opposite of the first surface, wherein the forming of the wiring member includes forming a plurality of inorganic insulating layers and a plurality of wiring layers on the first surface of the first inorganic substrate and forming an inorganic insulating layer, a wiring layer, and an organic insulating layer on the second surface of the first inorganic substrate, the organic insulating layer being an outermost insulating layer of the wiring member,
   wherein the second inorganic substrate includes a first surface on a side toward the adhesive part and a second surface on a side opposite of the first surface,
   wherein the forming of the reinforcement member includes forming a plurality of inorganic insulating layers on the first surface of the second inorganic substrate and forming an inorganic insulating layer and an organic insulating layer on the second surface of the second inorganic substrate, so that the plurality of inorganic insulating layers formed on the first surface of the first inorganic substrate and the plurality of inorganic insulating layers formed on the first surface of the second inorganic substrate have the same layer configuration, and so that the inorganic insulating layer and the organic insulating layer formed on the second surface of the first inorganic substrate and the inorganic insulating layer and the organic insulating layer formed on the second surface of the second inorganic substrate have the same layer configuration.

2. The method of clause 1, wherein the forming of the wiring member includes
   depositing the plurality of inorganic insulating layers on the first surface of the first inorganic substrate at a first temperature,
   reducing the thickness of the first inorganic substrate by polishing the second surface of the first inorganic substrate,
   temporarily adhering a support on the plurality of inorganic insulating layers interposed by an adhesive material, and
   forming the organic insulating layer on the second surface of the first inorganic substrate by curing a resin material at a second temperature.

3. The method of clause 1,
   wherein at least one of the inorganic insulating layers formed on the first inorganic substrate is formed to include first and second insulating films,
   wherein at least one of the inorganic insulating layers formed on the second inorganic substrate is formed to include first and second insulating films.

4. The method of clause 1,
   wherein the plurality of inorganic insulating layers formed on each of the first surfaces of the first and second inorganic substrates include a first inorganic insulating layer positioned closest to the first surface and a second inorganic insulating layer layered on the first inorganic insulating layer,
   wherein the first inorganic insulating layer is formed to include a silicon oxide film,
   wherein the second inorganic insulating layer is formed to include a silicon nitride film and a silicon oxide film layered on the silicon nitride film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. An interposer comprising:
   a wiring member including a first inorganic substrate;
   a reinforcement member including a second inorganic substrate, the reinforcement member being formed on the first inorganic substrate; and
   an adhesive part interposed between the wiring member and the reinforcement member;
   wherein the first inorganic substrate includes a first surface on a side toward the adhesive part and a second surface on a side opposite of the first surface,
   wherein a plurality of inorganic insulating layers and a plurality of wiring layers are formed on the first surface of the first inorganic substrate,
   wherein an inorganic insulating layer, a wiring layer, and an organic insulating layer are formed on the second surface of the first inorganic substrate,
   wherein the second inorganic substrate includes a first surface on a side toward the adhesive part and a second surface on a side opposite of the first surface,
   wherein a plurality of inorganic insulating layers are formed on the first surface of the second inorganic substrate, wherein an inorganic insulating layer and an organic insulating layer are formed on the second surface of the second inorganic substrate,
wherein the plurality of inorganic insulating layers formed on the first surface of the first inorganic substrate and the plurality of inorganic insulating layers formed on the first surface of the second inorganic substrate have the same layer configuration and are arranged symmetrically in a vertical direction with the adhesive part centered therebetween,
wherein the inorganic insulating layer and the organic insulating layer formed on the second surface of the first inorganic substrate and the inorganic insulating layer and the organic insulating layer formed on the second surface of the second inorganic substrate have the same layer configuration and are arranged symmetrically in the vertical direction with the adhesive part;
wherein the organic insulating layer formed on the second surface of the first inorganic substrate is an outermost insulating layer of the wiring member;
wherein the organic insulating layer formed on the second surface of the second inorganic substrate is an outermost insulating layer of the reinforcement member.

2. The interposer as claimed in claim 1,
wherein the first and second inorganic substrates have the same thicknesses,
wherein the plurality of inorganic insulating layers formed on the first surface of the first inorganic substrate and the plurality of inorganic insulating layers formed on the first surface of the second inorganic substrate have the same thicknesses,
wherein the inorganic insulating layer and the organic insulating layer formed on the second surface of the first inorganic substrate and the inorganic insulating layer and the organic insulating layer formed on the second surface of the second inorganic substrate have the same thicknesses.

3. The interposer as claimed in claim 1,
wherein the reinforcement member has a frame-like shape from a plan view,
wherein the plurality of wiring layers formed on the first surface of the first inorganic substrate includes a pad exposed within the frame-like shape.

4. The interposer as claimed in claim 1,
wherein at least one of the inorganic insulating layers formed on the first inorganic substrate includes first and second insulating films,
wherein at least one of the inorganic insulating layers formed on the second inorganic substrate includes first and second insulating films.

5. The interposer as claimed in claim 1,
wherein the plurality of inorganic insulating layers formed on each of the first surfaces of the first and second inorganic substrates include a first inorganic insulating layer positioned closest to the first surface and a second inorganic insulating layer layered on the first inorganic insulating layer,
wherein the first inorganic insulating layer includes a silicon oxide film,
wherein the second inorganic insulating layer includes a silicon nitride film and a silicon oxide film layered on the silicon nitride film.

6. An electronic component package comprising:
the interposer of claim 3; and
an electronic component mounted on the pad of claim 3.

* * * * *